US008680853B2

(12) United States Patent
Zakosarenko et al.

(10) Patent No.: US 8,680,853 B2
(45) Date of Patent: Mar. 25, 2014

(54) SQUID-SYSTEM HAVING INCREASED FLUX VOLTAGE TRANSFER FUNCTION

(75) Inventors: Vyacheslav Zakosarenko, Jena (DE); Ronny Stolz, Apolda (DE); Hans-Georg Meyer, Jena (DE)

(73) Assignee: Institut fuer Photonische Technologien E.V., Jena (DE)

( * ) Notice: Subject to any disclaimer, the term of this patent is extended or adjusted under 35 U.S.C. 154(b) by 171 days.

(21) Appl. No.: 13/130,100

(22) PCT Filed: Nov. 18, 2009

(86) PCT No.: PCT/DE2009/001655
§ 371 (c)(1),
(2), (4) Date: Aug. 5, 2011

(87) PCT Pub. No.: WO2010/057487
PCT Pub. Date: May 27, 2010

(65) Prior Publication Data
US 2011/0285393 A1     Nov. 24, 2011

(30) Foreign Application Priority Data
Nov. 19, 2008   (DE) .......................... 10 2008 058 308

(51) Int. Cl.
*G01R 33/02*  (2006.01)
(52) U.S. Cl.
USPC ........................................................ 324/248
(58) Field of Classification Search
USPC ........................................................ 324/248
See application file for complete search history.

(56) References Cited

U.S. PATENT DOCUMENTS 6,690,162 B1    2/2004  Schopohl et al.

FOREIGN PATENT DOCUMENTS

| DE | 10043657 | 7/2001 |
|---|---|---|
| EP | 1135694 | 9/2001 |

OTHER PUBLICATIONS

Jun. 2007 "Development of SQIF-Based Output Broad Band Amplifier" Victor K. Kornev et al. IEEE Transactions on Applied Superconductivity vol. 17, No. 2 pp. 569-572.
1982 "Physics and Applications of the Josephson Effect" Antonio Barone et al. A Wiley-Interscience Publication, John Wiley & Sons, New York pp. 383-408.
Mar. 16, 1989 "SQUID magnetometers for Low-Frequency Applications" Tapani Ryhaenen et al. Journal of Low Temperature Physics vol. 76, Nos. 5/6 pp. 287-386.
Mar. 1993 "Two-Stage Integrated Squid Amplifier with Series Array Output" Richard P. Welty et al. IEEE Transactions on Applied Superconductivity vol. 3, No. 1 pp. 2605-2608.
2004 "The SQUID Handbook" J. Clarke et al. Wiley-VCH Verlag GmbH & Co. KGaA, Weinheim vol. 1, Fundamentals and technology of SQUIDs and SQUID Systems pp. 137-141.
Jun. 1997 "A Low-Noise, Two-Stage Dc SQUID Amplifier with High Bandwidth and Dynamic Range" Robin Cantor et al. IEEE Transactions on Applied Superconductivity vol. 7, No. 2 pp. 3033-3036.

(Continued)

*Primary Examiner* — Reena Aurora
(74) *Attorney, Agent, or Firm* — Jordan and Hamburg LLP (57) ABSTRACT

The invention relates to a SQUID system having an increased flux voltage transfer function. The object of disclosing a circuit configuration providing an increased flux voltage transfer function of a SQUID, wherein the measurement sensitivity of the system is noticeably increased and the required readout electronics are simplified, is achieved in that at least one SQIF is provided as an amplifier circuit and is connected downstream of the first SQUID, wherein a coupling coil electrically connected to the first SQUID is directly associated with all loops of the SQIF.

9 Claims, 7 Drawing Sheets

(56) References Cited

OTHER PUBLICATIONS

Mar. 2001 "SQUID Operational Amplifier" K.D. Irwin et al. IEEE Transactions on Applied Superconductivity vol. 11, No. 1 pp. 1265-1270.

Mar. 2001 "Superconducting Multiple Loop Quantum Interferometers" Joerg Oppenlaender et al. IEEE Transactions on Applied Superconductivity vol. 11, No. 1 pp. 1271-1274.

Mar. 2001 "LC-Resonant Voltage Response of Superconducting Quantum Interference Filters" CH. Haeussler et al. IEEE Transactions on Applied Superconductivity vol. 11, No. 1 pp. 1275-1278.

SQUID-SYSTEM HAVING INCREASED FLUX VOLTAGE TRANSFER FUNCTION

BACKGROUND OF THE INVENTION

The invention relates to a SQUID system having an increased flux voltage transfer function.

The present invention refers to a superconducting quantum interference device, dc SQUID adapted for the very sensitive measurement of the magnetic flux and other physical quantities which may be converted into a magnetic flux (such as, for example, magnetic fields, magnetic field gradients, electrical current, and so forth).

Figure 1A:
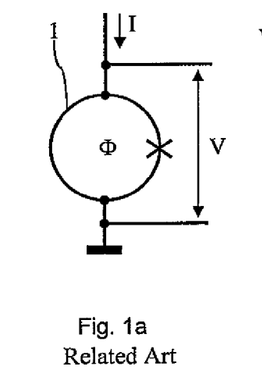
FIG. 1a shows, according to the known state of the art, a single dc SQUID 1.

The superconducting quantum interference devices, dc SQUIDs are at present the most sensitive detectors for determining a magnetic flux. Their function is based upon two physical phenomena, namely upon the quantizing of the magnetic flux within a superconducting loop and upon the Josephson Effect of two weakly coupled superconductors. A SQUID is a superconducting loop interrupted by at least one Josephson contact. There are known two basic kinds of SQUIDs [refer to A. Barone, G. Paterno: "Physics and Application of the Josephson Effect" A Wiley-Interscience Publication, John Wiley & Sons, New York (1982)], namely the rf SQUID and the dc SQUID. A superconducting loop which has only one Josephson contact is called rf SQUID. It is coupled to a radiofrequency tank circuit and in general is operated by an rf flux. The loop which is interrupted by at least two Josephson contacts is named dc SQUID, because it mostly is operated by a direct current (in this instance refer to FIG. 1$a$) flowing through the at least two contacts. The present invention refers to the use of a dc SQUID which is the sensitive element.

Figure 1B:
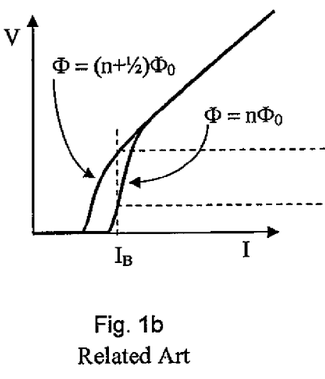
FIG. 1b shows, according to the known state of the art, a current-voltage characteristic (I-V-characteristic) of the dc SQUID at the two extreme values of the flux ($\Phi$) in the SQUID, wherein $\Phi_0$ represents one flux quantum.
Figure 1C:
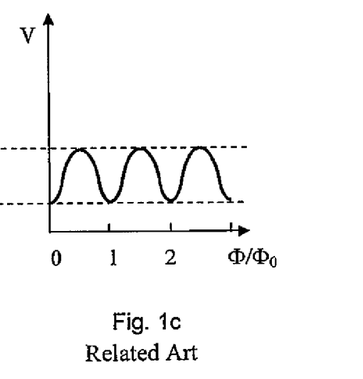
FIG. 1c shows, according to the known state of the art, a flux-voltage characteristic ($\Phi$-V-characteristic) of the SQUID when it is charged with an operational current $I_B$.

The critical current of the Josephson contact is a periodical function of the phase difference of the wave function of the charge carriers passing the contacts, whereby the phase difference occurs across the contact. The magnetic flux permeating the loop determines the phase difference, wherein a magnetic flux quantum $\Phi_0 = h/2 = 2.0710 \cdot 10^{-15}$ Vs represents a characteristic magnitude. Therefrom the periodic dependency of the critical current results as a function of the flux with the period of a magnetic flux quantum $\Phi_0$ (refer to FIG. 1$b$). When the SQUID is operated with dc current the voltage drop across the Josephson contacts is also a periodic function of the magnetic flux permeating the loop (refer to FIG. 1$c$). Thus, the SQUID is a flux-voltage-transducer. The typical voltage rise of the presently available SQUIDs is about 50 μV and the maximal value of the transfer function is about 200 μV/$\Phi_0$. The typical SQUIDs only permit measurements of variations in the magnetic flux of far less than one flux quantum $\Phi_0$. The intrinsic SQUID noise can be of an order of $10^{-6}$ $\Phi_0/Hz^{1/2}$ [T. Ryhänen, H. Seppä, R. llomoniemi and J. Knuutila: "SQUID Magnetometers for Low-Frequency Applications" J. Low Temp. Physics, 76, pp 287-386 (1989)].

Figure 2A:
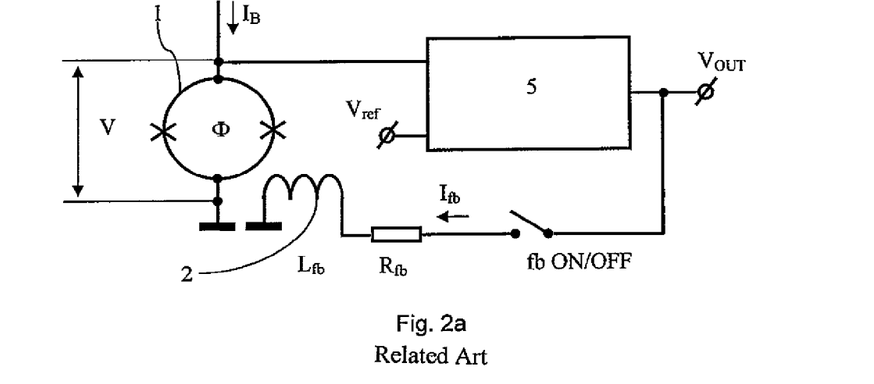
FIG. 2a shows, according to the known state of the art, a dc SQUID 1 having a feedback electronics. When the switch fb ON/OFF is shut ("ON" position) the electronics produces a current $I_{fb}$ which is proportional to voltage difference $V-V_{ref}$ across the resistor $R_{fb}$ and the feedback coil 2.
Figure 2B:
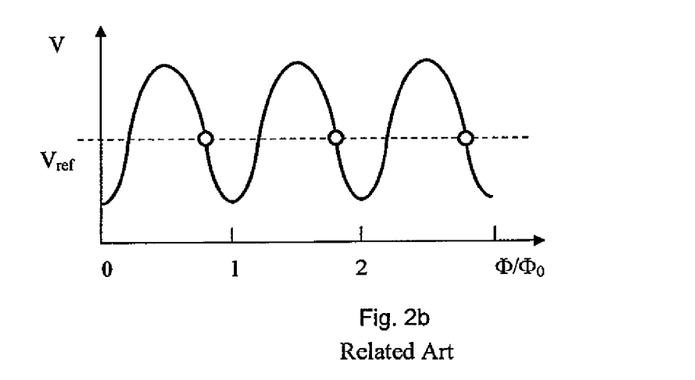
FIG. 2b shows, according to the known state of the art, the SQUID voltage as a function of the flux in the SQUID. The feedback coupling circuit keeps the entire flux constant in the SQUID in the vicinity of the operation points which are designated by circles, that is where the voltage difference $V-V_{ref}$ approximates zero.

In order to be able to use a SQUID sensor it is necessary to linearize the periodical flux-voltage characteristic. The respective standard method is to employ the SQUID as a zero detector. To this end, a flux variation which is to be measured will be compensated via a current flowing through a coil (feedback coil) which is inductively coupled to the SQUID. FIG. 2$a$ shows an example for such a known solution according to the state of art. The Fig. schematically shows a SQUID in combination with a read-out electronics, the so-called feedback electronics or control loop. The feed-back electronics 5 picks up the voltage (V) from the SQUID 1, compares said voltage to a reference voltage ($V_{ref}$) and amplifies the difference. When the feed-back switch (fb ON/OFF) is closed, a feed-back current ($I_{fb}$) flows through a feed-back coil 2, whereby the feed-back current compensates the flux changes effected by a signal, thus the entire flux is kept constant in the SQUID. This means that the SQUID takes a stable point upon the flux-voltage characteristic (one of the circles in FIG. 2$b$). Hence, due to the characteristic being periodical, there exist numerous of such stable operating points which are remote from one another by an integer number of magnetic flux quanta. A SQUID together with this shown feedback electronics is known as the so-called flux-locked-loop (FLL). The output voltage of the FLL ($V_{out}$) is directly proportional to the current ($I_{fb}$) which is required for compensating the signal flux.

Two basic kinds of FLL-electronics are known, these are the flux modulated electronics and the directly coupled electronics [J. Clarke, A. Braginski: "The SQUID Handbook" WILEY-VCH Verlag GmbH & Co. KGaA, Weinheim, (2006)].

The first mentioned employs the method of flux modulation to obtain an alternating voltage signal from a dc SQUID operated with a dc current. A transformer network provides for matching the impedances of the low-ohmic SQUID to the high-ohmic input of the first amplifier stage of the FLL-electronics. Then, after demodulation and integration, the signal will be passed as a current through the feedback coil. In such an electronics system the band width and the signal sequence rate (slew rate) are limited by the modulation frequency so that it cannot be used in many applications. The directly coupled electronics potentially functions also at higher frequencies and signal sequence rates. But the essential disadvantage of this electronics is the lack of matching the impedances of the SQUID to the amplifier input. Hence the intrinsic noise of the electronics as well as of the drift plays an important role in the noise limited resolution of the system. These problems occur above all at low frequencies, so that the application is restricted in some cases. Apart from the development of extremely low noise electronics, a SQUID transfer function increase is a possibility to evade the problem of an electronics noise. This is the reason why several approaches have been made to raise the flux-voltage-transfer function.

Figure 3A:
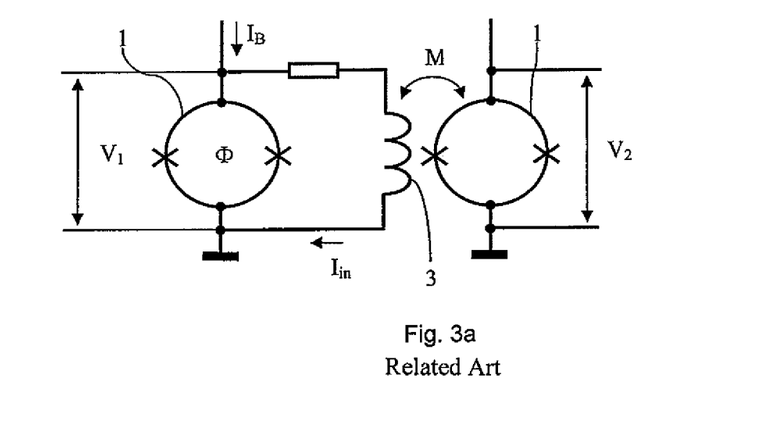
FIG. 3a shows, according to the known state of the art, an arrangement of two dc SQUIDs in which a portion $I_{in}$ of the operational current $I_B$ of the signal SQUID flows with the voltage $V_1$ through the input coil 3 of the second SQUID with the voltage $V_2$. The second SQUID is operated as an amplifier.

One possible way to raise the transfer function is the use of a multi-stage system wherein the SQUID signal of the first stage is amplified in a second one. The second stage can be a single SQUID (refer to FIG. 3$a$) or even an array of a number of series connected SQUIDs, wherein the SQUIDs are identical to one another as concerns their geometric formation and their electric parameters [refer to: R. P Welty, J. M. Martinis: "Two-stage integrated SQUID amplifier with series array output" IEEEE Trans. Applied Superconductivity, 3, pp. 2605-2608 (1993) and R. Cantor, L. P. Lee, A. Matlashov, V. Vinetskiy: "A Low-Noise, Two-Stage DC SQUID Amplifier with High Bandwidth and Dynamic Range", IEEE Trans. Applied Supercond. 7, pp. 3033-3036 (1997)].

Figure 3B:
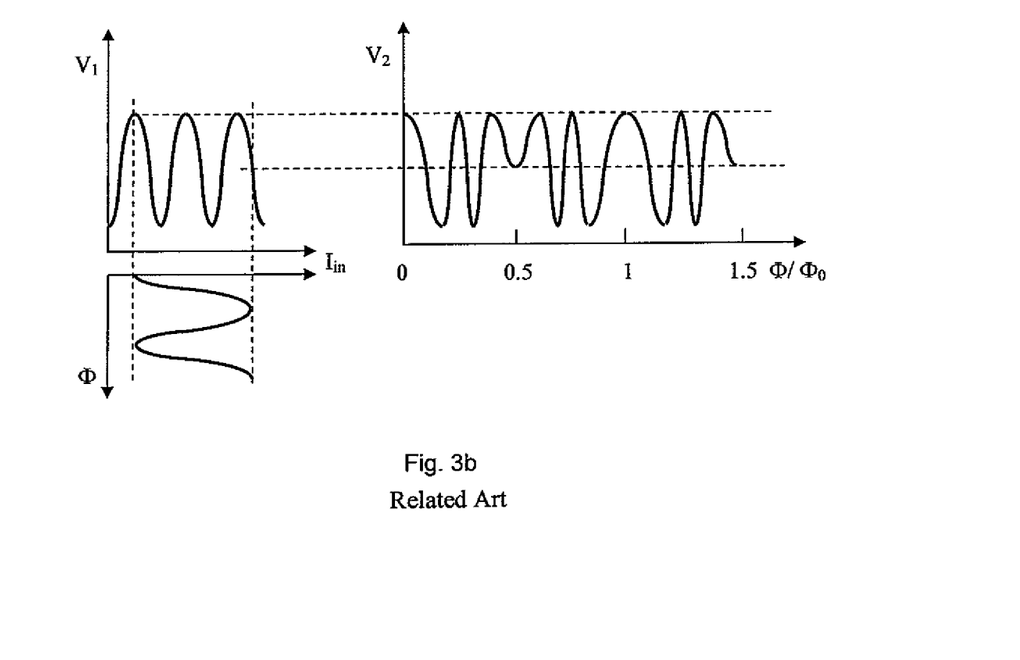

Thus, the obtainable raise of the flux-voltage-transfer function according to the prior art is exemplified in FIG. 3$b$. One disadvantage of the respective two-stage-system is also made visible in FIG. 3$b$. The resulting flux-voltage curve is very complicated due to the periodicities of the SQUID and in the SQUID-array and leads to a number of stable operation points of the FLL having respective different transfer functions and noise characteristics.

A further possibility to linearize the flux-voltage characteristic is to directly feed back the output signal of a multi-stage-SQUID system. This approach was made in K. D. Irwin, M. E. Hubert: "SQUID Operational Amplifier", IEEE Trans. Applied Supercond. 11, 1265-1270 (2001). The idea of this approach is to feedback a portion of the operational current ($I_{B2}$) of the last SQUID-array stage into the feedback coil of the SQUID of the first stage (refer to FIG. 4). Thus, the read-out electronics being at ambient temperature is reduced to a simple amplifier. However, the disadvantage of this approach remains the same. When the flux control loop is interrupted due to external interferences, a new not foreseeable operation point will set.

Recently, a new type of a superconducting multi-contact arrangement has been proposed, named Superconducting Quantum Interference Filter (SQIF) [EP 1 135 694 B1; DE 100 43 657 A1] for an entirely different application, namely, intended for a high precision absolute measurement of time-variable magnetic fields. This proposal substantially concerns an array out of a plurality of differently designed SQUIDs which are connected either in series or in parallel. A flux-current characteristic having only one extremum (maximum of the critical current or minimum of the voltage at a constant operating current) can be achieved by a special arrangement of the SQUID areas. Said extremum lies in the vicinity of the point at which the flux in each of the loops which form the SQIF is zero. This permits the absolute measurement of the magnetic flux and field, respectively, whereas the standard SQUID-systems only permit the measurement of the variations of the magnetic flux. A detailed description of the setup and function of the SQIF can be found in J. Oppenländer, Th. Träuble, Ch. Häussler, N. Schopohl: "Superconducting Multiloop Quantum Interferometer", IEEE Trans. Applied Supercond. 11, pp. 1271-1274 (2001).

SUMMARY OF THE INVENTION

The object of the present invention is to provide a circuit arrangement which supplies an increased FLUX-VOLTAGE-TRANSFER-function of a dc SQUID which considerably increases the measuring sensitivity of the system and simplifies the required reading electronics.

The present invention proposes to employ a SQIF as a current sensor having at the input a superconducting coil as a second stage of a two-stage read-out of the SQUID, wherein the SQIF designs according to the invention is subject to basic changes which will be disclosed in detail in the specific description. The subject of the invention consists in that at least one SQIF is provided as an amplifier circuit downstream to the first dc SQUID, wherein one input coil electrically connected to the first SQUID for inductive coupling is directly associated to all loops of the SQIF.

The invention will be explained in more detail by virtue of the subsequent embodiments in connection with the respective figures.

BRIEF DESCRIPTION OF THE DRAWINGS

FIG. 3b shows, according to the known state of the art, the resulting flux-voltage characteristic of the arrangement according to FIG. 3a;

DETAILED DESCRIPTION OF THE INVENTION

To begin with and for better understanding of the invention, the heretofore common way in the prior art for amplifying the signals of a dc SQUID will be outlined by reference to the FIGS. 1 to 4:

To this end FIG. 1a shows a single dc SQUID 1 and FIG. 1b a current-voltage characteristic (I-V-characteristic) of the dc SQUID at the two extreme values of the flux ($\Phi$) in the SQUID, wherein $\Phi_0$ stands for a flux quantum. FIG. 1c shows the respective flux-voltage characteristic (Φ-V-characteristic) of the SQUID when it is provided with an operational current feed $I_B$.

FIG. 2a shows a dc SQUID 1 having the usual feedback electronics. When the switch fb ON/OFF is shut ("ON" position) the electronics 5 produces a current $I_{fb}$ which is proportional to the voltage difference $V-V_{ref}$ across the resistor $R_{fb}$ and the feedback coil $L_{fb}$. FIG. 2b shows the corresponding SQUID voltage as a function of the flux in the SQUID. The feedback coupling circuit keeps the entire flux constant in the SQUID in the vicinity of the operation points which are designated by circles in FIG. 2b, that is where the voltage difference $V-V_{ref}$ approximates zero.

FIG. 3a shows a second circuit arrangement principally possible according to the state of art which was already mentioned at the beginning, namely an arrangement of two dc SQUIDs 1 in which a portion $I_{in}$ of the operational current $I_B$ of the signal SQUIDs having the voltage $V_1$ flows through the input coil 3 of the second SQUID with the voltage $V_2$. The second SQUID (on the right side of the figure) operates as an amplifier. The disadvantages resulting from such a circuitry can be clearly seen in FIG. 3b, which shows the resulting flux-voltage characteristic of the arrangement in the right part of the figure.

Figure 4:
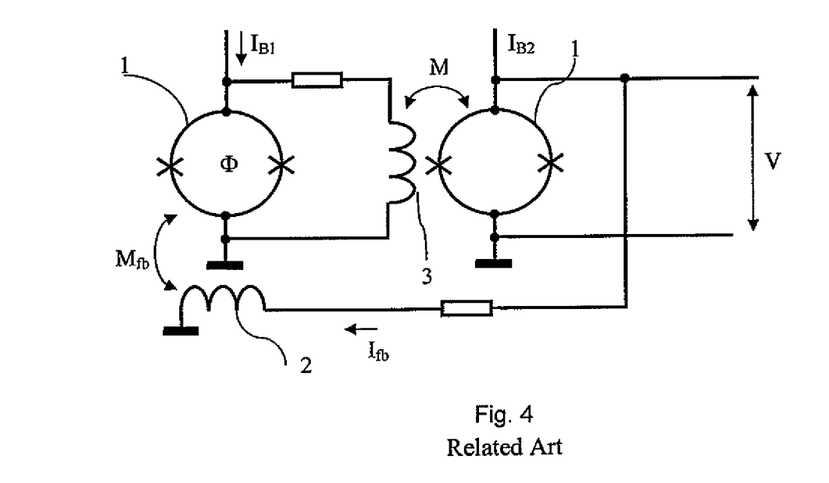
FIG. 4 shows, according to the known state of the art, a two-stage SQUID system having an internal feedback. A portion $I_{fb}$ of the operational current $I_{B2}$ flows through the input coil 2 of the signal SQUID and thus produces a feedback coupling to that SQUID.

FIG. 4 represents a further known circuit version according to the state of art wherein a two-stage SQUID system having an internal feedback is shown. A portion $I_{fb}$ of the operational current $I_{B2}$ of the second SQUID flows through the input coil 2 of the signal SQUID and thus produces a feedback to the first SQUID 1.

All the versions described above represent the known previous art so far with their disadvantages. From now on a detailed special description of the present invention follows.

Figure 5A:
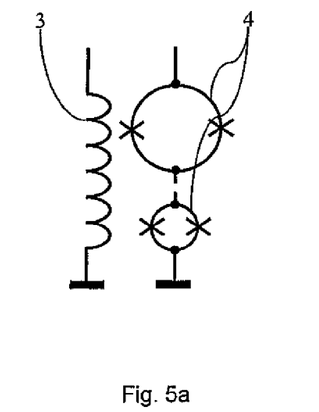
FIG. 5a shows a simplified schematic diagram of a SQIF (4) including an inventively integrated input coil 3 which will represent a SQIF in further drawings.

To begin with, reference is made to FIG. 5a which shows a simplified schematical view of a SQIF 4 including the inventively integrated input coil 3 which, in further figures, will represent SQIF 4, regardless of its further special embodiments.

At first, it is proposed according to the invention, to allocate (integrate) in the SQIF 4 one input coil 3 coupled to all loops of the SQIF, wherein said coil is capable of producing a magnetic flux. When there is no external magnetic field applied then the current through the input coil 3 determines the flux in the SQIF 4. When the respective operational current is applied, the voltage across the SQIF will then show, as a function of the input current, a strong peak (minimum) at a current having a zero amplitude. The operation of this SQIF with integrated input coil is only possible when the external magnetic flux in all SQIF loops is negligible. Otherwise the voltage peak can only be found in a few special cases.

Figure 5B:
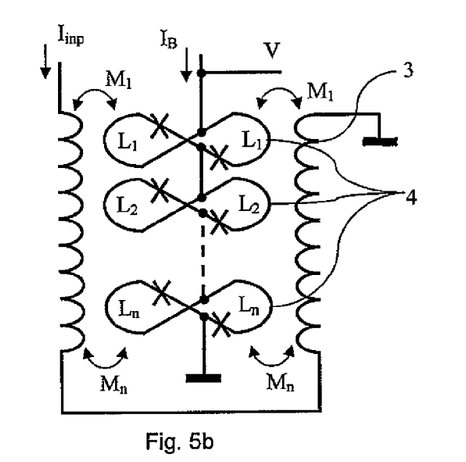
FIG. 5b shows a SQIF arrangement having an integrated input coil. SQIF (4) comprises a plurality of dc SQUIDs. In this example each of the dc SQUIDs is a gradiometer constituted of two loops which are interconnected with one another. All inductances $L_1 \ldots L_n$ of these SQUIDs are different. The input coil 3 generates a flux in all SQUIDs of the SQIF each having different mutual inductances $M_1 \ldots M_n$.

In order to eliminate the above mentioned problems there will be further proposed by the present invention to embody the individual SQIF loops in the form of two geometrically equally large loops symmetrically arranged to one another which are connected in a way that the flux generated by an external magnetic field is zero (gradiometer arrangement). Thus the interference of the external magnetic field may be reduced. The here above described special embodiment is schematically indicated in FIG. 5b. Therein a SQIF arrangement 4 is schematically shown with integrated series connected input coil 3. The SQIF 4 comprises a plurality of dc SQUIDs. In the present example each of the dc SQUIDs forms a gradiometer composed of two interconnected loops. All inductances $L_1 \ldots L_n$ of these SQUIDs are different from one another. The input coil generates a flux in all SQUIDs of the SQIF each with a different mutual inductances $M_1 \ldots M_n$. The here shown arrangement can also find entry into the further shown circuit arrangements according to FIG. 6a and FIG. 7, though for the sake of simplicity there is only made use of the schematic diagram according to FIG. 5a.

Figure 5C:
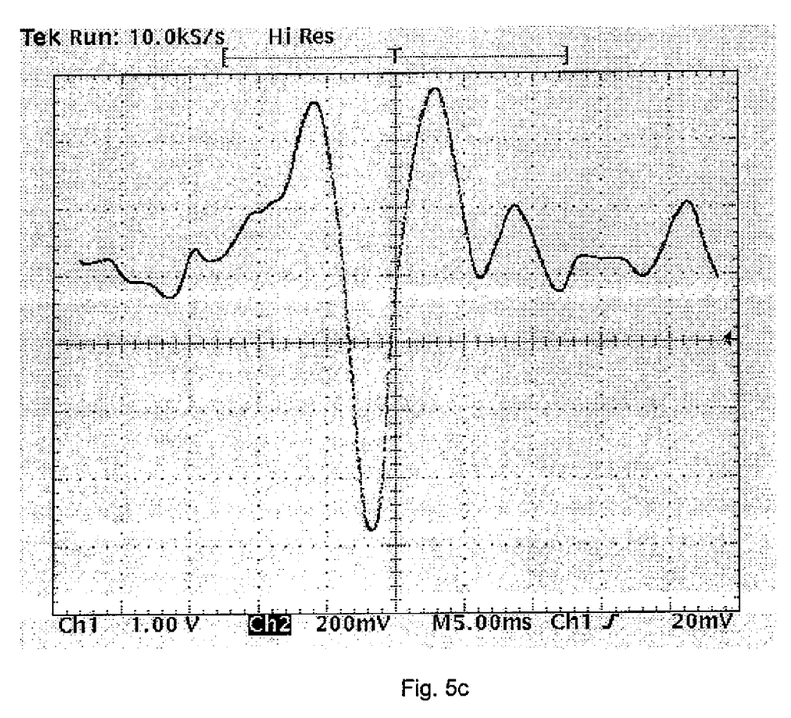
FIG. 5c shows an input current-voltage characteristic of a SQIF recorded by experiment, constituted of 56 series connected different SQUIDs. Vertical: voltage of 0.2 mV/div, and horizontal: input current of 10 µA/div.

The above proposals have been verified by experiment in the frame of the present invention. In the special example a SQIF was set up consisting of 56 gradiometer-dc-SQUIDs. The two loops of each gradiometer-SQUID were series connected. An input coil is integrated on each loop. An example of a voltage-coupling-current characteristic of the SQIF-current sensor obtained in this way by experiment is shown in FIG. 5c. Vertical: voltage of 0.2 mV/div and horizontal: input current of 10 µA/div (refer to FIG. 5c). It should be mentioned that the measurement was carried out without magnetic screening. That means that the SQIF was exposed to the terrestrial magnetic field. Hence, the present modified SQIF sensors are suited for use in the inventive proposed two-stage SQUID read-out by SQIFs.

Figure 6A:
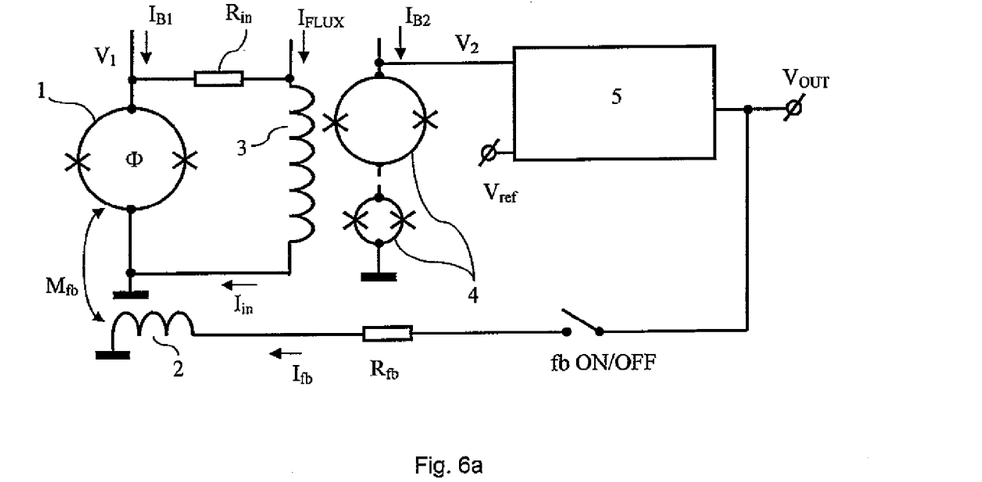
FIG. 6a shows schematically a first SQUID and SQIF arrangement proposed by the present invention.
Figure 6B:
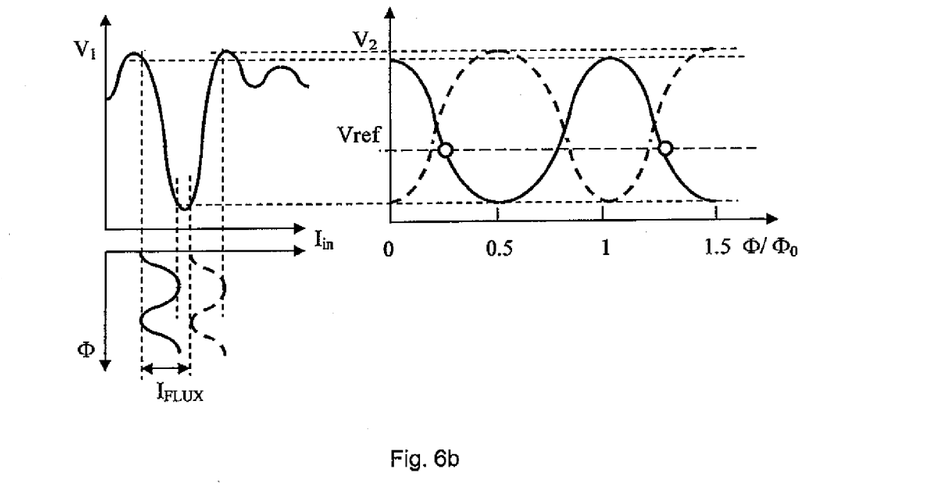
FIG. 6b shows the flux-voltage characteristic of the arrangement according to FIG. 6a without feedback, that is, the switch (fb) is open, hence, in the "OFF" position.

In FIG. 6a such a first SQUID-SQIF system is shown by example and schematically as a more detailed part of a complete circuitry. Herein SQIF 4 is represented by a series connection of a number of different SQUIDs indicated by a dashed line between the different SQUIDs of the SQIF (refer also to FIG. 5a). The input coil 3 is inductively coupled to each SQUID of the SQIF via mutual inductances $M_1 \ldots M_n$. As a result of such an inventive circuit arrangement the functional dependence of the SQIF-voltage $V_2$ versus the coupling current $I_{in}$ exhibits a pointed minimum as shown in FIG. 6b. The voltage $V_1$ across the first SQUID 1 generates across the resistor $R_{in}$ a current through the input coil 3 of the SQIF 4. In order to set the best operational point of the system a further current source is required which via a current $I_{FLUX}$ through the input coil of the SQIF produces a flux in the SQUID. Thus the flux in the SQIF 4 is the sum out of the signal from the first SQUID 1 $V_1/R_{in}$ and the offset flux caused by the current $I_{FLUX}$ of an additional current source (not shown in FIG. 6a). Due to the flux change (Φ) in the SQUID 1, the periodic voltage modulation of the first SQUID 1 generates a current modulation of $I_{in}$ and, hence, a changing SQIF voltage $V_2$. To obtain a maximal modulation of the voltage $V_2$ the amplitude of the offset current $I_{FLUX}$ has to be set such that the modulation of the current $I_{in}$ has to be carried out at the steepest part of the SQIF characteristic. It is obvious that due to the shape of the curve only two such operational points exist. As a result a flux (Φ)-SQIF-voltage-($V_2$) characteristic is obtained which looks like the flux-voltage characteristic of a single SQUID, however, with a considerably larger amplitude modulation of the voltage (refer to FIG. 6b, right side). Similar to a single SQUID there exist periodical operational points (circles in FIG. 6b, right side) about which the curve can be linearized by an FLL (compare also to FIG. 2b). The SQIF-voltage $V_2$ can be amplified, for example, by the FLL but also by a simpler amplifier circuit 5 which generates the feedback signal being fed by the feedback coil 2 into the first SQUID 1, provided that the switch fb is in the "ON" position. Otherwise, with the exception of a higher flux-voltage-transfer factor of the SQUID-SQIF circuit, the curve can be properly linearized just as done with a single SQUID.

Figure 7:
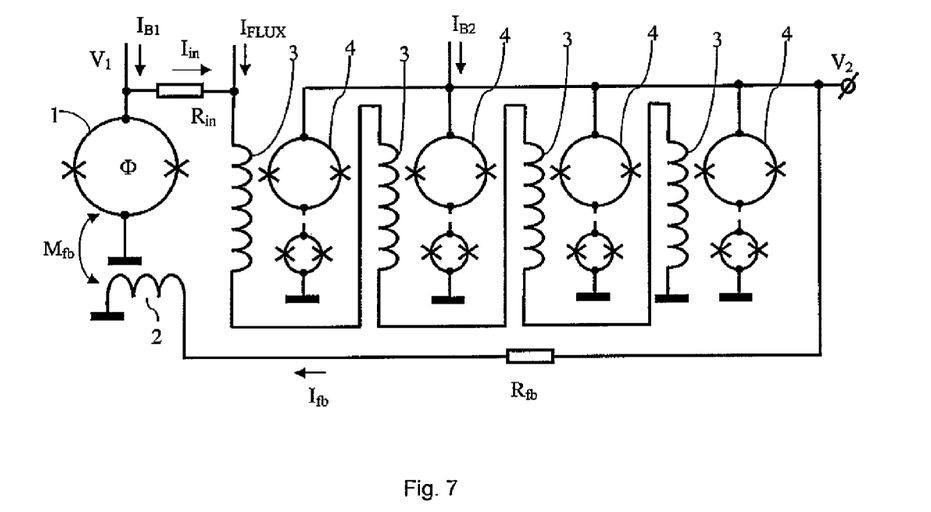
FIG. 7 shows a further example of a schematic circuit concerning an arrangement comprising a SQUID 1 and SQIF 4 having an internal feedback. In the present example to ensure a better feedback, four equal SQIFs are interconnected in a manner that the SQIFs are in parallel and their input coils 3 are series connected.

Furthermore, it is proposed within the frame of the invention to employ the SQIF with an integrated input coil for setting up a SQUID-SQIF arrangement having internal feedback. The fundamental schematic design of such an arrangement is shown in FIG. 7.

Since each SQIF can only drive a limited current otherwise loosing the amplitude of the voltage peak, it is furthermore proposed by the invention to connect in parallel a selectable number of SQIFs 4 to permit the flow of a higher current through the coil 3 of the first SQUID 1. A schematic setup of such a circuit formation is shown in FIG. 7. An arrangement consisting of SQUID and SQIFs having internal feedback can there be seen. In said special example and in order to achieve a better feedback four equal SQIFs 4 are interconnected, that is, the SQIFs 4 are connected in parallel and their respective input coils 3 are series connected. A part of the operation current of the SQUIDs $I_{BI}$ flows through the resistor $R_{in}$ and the input coils 3 of the SQIFs 4. Similar to FIG. 6a the optimal operation point for the SQIF can be set by an additional offset current $I_{FLUX}$. The feedback is achieved in that a part of the operational current of the SQIF ($V_2/R_{fb}$) flows through the feedback coil 2 of the first SQUID 1 which according to the invention can be embodied as a current sensor SQUID, or a magnetometer SQUID, or a gradiometer SQUID. The system with internal feedback automatically finds a stable operation point and keeps constant the flux in the first SQUID 1. Each change owing to an external flux is compensated by a current $I_{fb}$ through the feedback coil 2 so that the output voltage $V_2$ is proportional to the change of the external flux. When the amplitude of the external flux reaches the limit of a possible feedback, the system looses the operation point and jumps to the next possible stable operation point while one magnetic flux quantum ($\Phi_0$) leaves the SQUID 1. These jumps in the output voltage come from the $\Phi_0$-periodicity of the SQUID characteristic.

Figure 8:
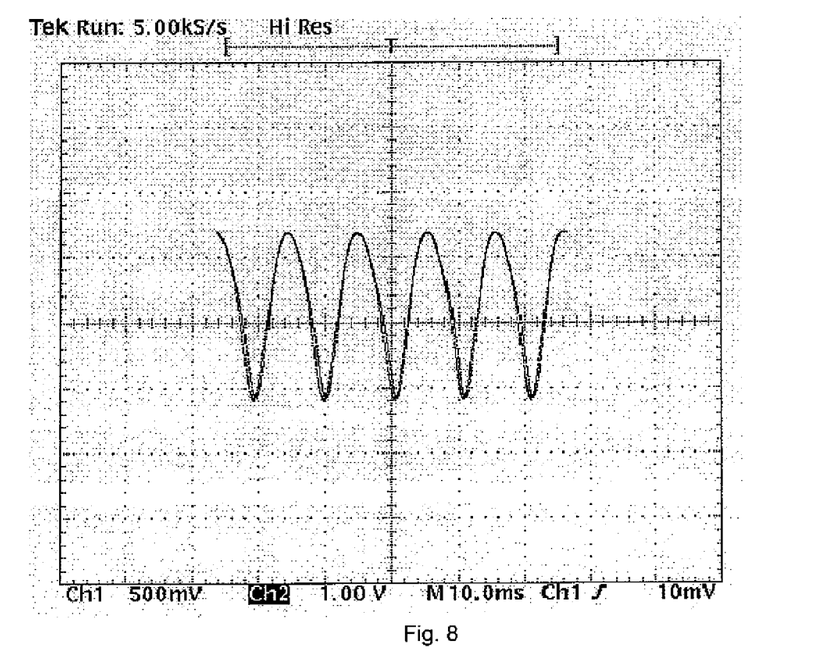
FIG. 8 shows an experimentally measured flux-voltage characteristic of an arrangement comprising a magnetometer SQUID and a SQIF which, in the present example, consists of 56 series connected SQUIDs, wherein the vertical axis designates the voltage $V_2$ with 1 mV/div., the horizontal axis: the magnetic field in arbitrary units.

At first and in order to demonstrate the operation mode of the inventive SQUID-SQIF arrangement and the resulting increase of the transfer function, such a system was set up without internal feedback (such one relates, however, to a further inventive embodiment) and comprising a highly sensitive magnetometer and an above described SQIF. The measured flux-voltage curve of the system is shown in FIG. 8. The curve is very similar to the characteristic of the single magnetometer SQUID except, due to the invention, the characteristic of this arrangement shows a voltage-flux-transfer-function higher by a factor of 20.

Figure 9:
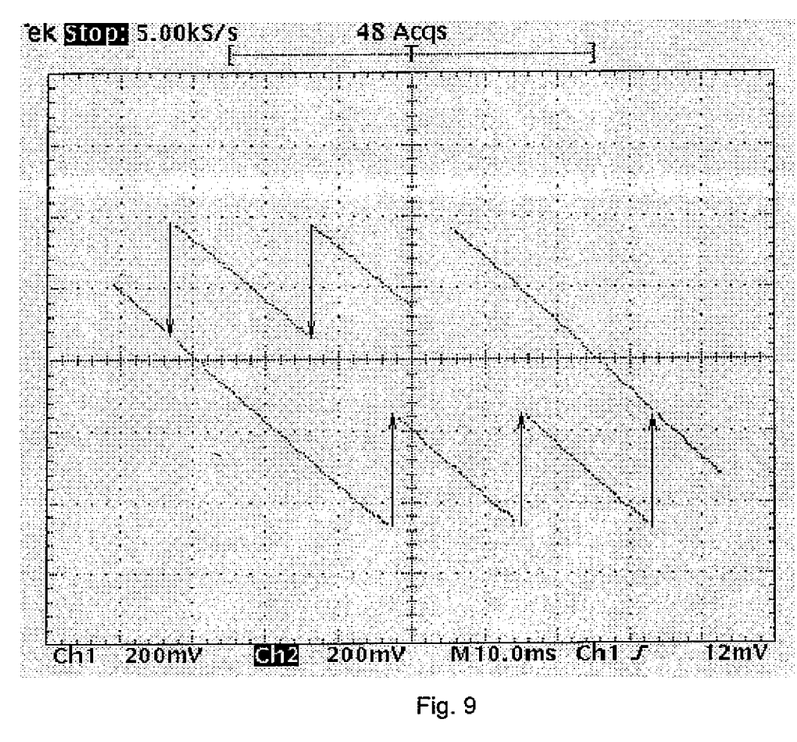
FIG. 9 shows a record of the flux-voltage characteristic of the SQUID-SQIF system with internal feedback according to FIG. 7, wherein the vertical axis designates the voltage $V_2$ with 0.2 mV/div., and the horizontal axis, the magnetic field in arbitrary units. The arrows show the jumps in the characteristic at which a magnetic flux quantum either leaves or enters the magnetometer SQUID.

The SQIFs described herein before were subsequently utilized to set up an arrangement having internal feedback. In the special example four SQIFs were connected in parallel. The input coils of the SQIFs were series connected. The voltage of the magnetometer SQUID was converted by a resistor into a current which flows through the input coils of the SQIFs, the principle being shown in FIG. 7. The measured flux-voltage characteristic of this arrangement is shown in FIG. 9. Therein the vertical axis designates the voltage $V_2$ of 0.2 mV/div.; the horizontal axis the magnetic field in arbitrary units. The arrows in the graph represent the jumps in the characteristic at which one magnetic flux quantum leaves or enters the magnetometer SQUID 1.

The linearization of the curve is clearly to be seen. When the output voltage arrives at a threshold value then a jump by one magnetic flux quantum occurs. Besides the linearization of the characteristic solely obtained by the proposed circuit arrangement without the use of a FLL electronics, the desired advantage is achieved that the output voltage is distinctly higher than that of a single SQUID. As a result the requirements to subsequent downstream electronic circuits are reduced which do not lie within the scope of the present invention and therefore are herein not described in detail.

All features specified in the description, the embodiments, the claims and/or in the drawings utilized individually as well as in any combination with one another, are essentially within the scope of the invention.

The invention claimed is:

1. A superconducting quantum interference device system having an increased flux-voltage-transfer function, comprising:

a first dc superconducting quantum interference device;

at least one superconducting quantum interference filter functioning as an amplifier circuit and arranged downstream from the first superconducting quantum interference device; and one input coil electrically connected to the first superconducting quantum interference device; and wherein said one input coil is inductively directly coupled to all loops of the superconducting quantum interference filter; and wherein the at least one superconducting quantum interference filter comprises a plurality of single superconducting quantum interference filters electrically connected to one another in parallel.

2. A superconducting quantum interference device system according to claim 1, further comprising a feedback coil and wherein superconducting quantum interference filter voltage take-off takes place directly at output of the superconducting quantum interference filter and generates a feedback signal which is coupled via the feedback coil to the first superconducting quantum interference device.

3. A superconducting quantum interference device system according to claim 1, further comprising a feedback coil and wherein superconducting quantum interference filter voltage is amplified by an amplifier circuit which generates a feedback signal which is coupled via the feedback coil to the first superconducting quantum interference device.

4. A superconducting quantum interference device system according to claim 3, wherein the amplifier circuit is a flux locked loop which includes the first superconducting quantum interference device.

5. A superconducting quantum interference device system according to claim 1, further comprising an auxiliary current source associated with the input coil, current from the auxiliary current source generating a presettable flux in the superconducting quantum interference filter.

6. A superconducting quantum interference device system having an increased flux-voltage-transfer function, comprising a first dc superconducting quantum interference device, at least one superconducting quantum interference filter functioning as an amplifier circuit and arranged downstream from the first superconducting quantum interference device, and one input coil electrically connected to the first superconducting quantum interference device; and wherein said one input coil is inductively directly counted to all loops of the superconducting quantum interference filter; and wherein the at least one superconducting quantum interference filter comprises a plurality of single superconducting quantum interference filters electrically connected to one another in parallel;

wherein a plurality of input coils is provided;

wherein each one input coil of the plurality of input coils is inductively directly coupled to all loops of a corresponding one of the superconducting quantum interference filters, respectively; and wherein all of said plurality of input coils are connected to one another in series and are electrically connected to the first superconducting quantum interference device.

7. A superconducting quantum interference device system according to claim 6, wherein each superconducting quantum interference filter comprises a plurality of dc superconducting quantum interference devices each having an inductance different from that of the others of said plurality of dc superconducting quantum interference devices and each dc superconducting quantum interference device of said plurality of dc superconducting quantum interference devices is in the form of a gradiometer comprising two interconnected loops.

8. A superconducting quantum interference device system having an increased flux-voltage-transfer function, comprising a first dc superconducting quantum interference device, at least one superconducting quantum interference filter functioning as an amplifier circuit and arranged downstream from the first superconducting quantum interference device, an one input coil electrically connected to the first superconducting quantum interference device; and wherein said one input coil is inductively directly coupled to all loops of the SQIF; and wherein the at least one superconducting quantum interference filter comprises a plurality of superconducting quantum interference filters electrically connected to one another in parallel;

wherein for each one superconducting quantum interference filter of the plurality of superconducting quantum interference filters there is a respective one input coil among a corresponding plurality of input coils;

wherein for each one superconducting quantum interference filter of the plurality of superconducting quantum interference filters only said respective one input coil is inductively directly coupled to all loops of said one superconducting quantum interference filter; and wherein all of said plurality of input coils are connected to one another in series and are electrically connected to the first superconducting quantum interference device.

9. A superconducting quantum interference device system according to claim 8, wherein each superconducting quantum interference filter comprises a plurality of dc superconducting quantum interference devices each having an inductance different from that of the others of said plurality of dc superconducting quantum interference devices and each dc superconducting quantum interference device of said plurality of dc superconducting quantum interference devices is in the form of a gradiometer comprising two interconnected loops.

* * * * *